(12) United States Patent
Kazama

(10) Patent No.: US 6,717,421 B1
(45) Date of Patent: Apr. 6, 2004

(54) ELECTRIC CONTACT PROBE ASSEMBLY

(75) Inventor: Toshio Kazama, Nagano (JP)

(73) Assignee: NHK Spring Co., Ltd., Yokohama (JP)

(*) Notice: Subject to any disclaimer, the term of this patent is extended or adjusted under 35 U.S.C. 154(b) by 0 days.

(21) Appl. No.: 10/070,793

(22) PCT Filed: Sep. 7, 2000

(86) PCT No.: PCT/JP00/06106
§ 371 (c)(1),
(2), (4) Date: Mar. 8, 2002

(87) PCT Pub. No.: WO01/18553
PCT Pub. Date: Mar. 15, 2001

(30) Foreign Application Priority Data

Sep. 9, 1999 (JP) .............................. 11-256252

(51) Int. Cl.[7] .............................................. G01R 31/02
(52) U.S. Cl. ...................... 324/754; 174/261; 174/267
(58) Field of Search .................... 174/261, 267; 439/65–75; 324/754–762

(56) References Cited

U.S. PATENT DOCUMENTS

| | | | | |
|---|---|---|---|---|
| 5,297,967 A | * | 3/1994 | Baumberger et al. | 439/66 |
| 5,794,330 A | * | 8/1998 | Distefano et al. | 29/840 |
| 6,095,823 A | * | 8/2000 | Banks | 439/66 |
| 6,474,997 B1 | * | 11/2002 | Ochiai | 439/70 |

FOREIGN PATENT DOCUMENTS

| | | |
|---|---|---|
| JP | 3-20780 | 9/1991 |
| JP | 9-184852 | 7/1997 |
| JP | 9-329624 | 12/1997 |
| JP | 10-19926 | 1/1998 |
| JP | 11-133062 | 5/1999 |

OTHER PUBLICATIONS

Patent Abstracts of Japan, Publication No. 03–202780, Sep. 4, 1991.
Patent Abstracts of Japan, Publication No. 09–184852, Jul. 15, 1997.
Patent Abstracts of Japan, Publication No. 09–329624, Dec. 22, 1997.

* cited by examiner

Primary Examiner—John B. Vigushion
Assistant Examiner—Jeremy Norris
(74) Attorney, Agent, or Firm—MacPherson Kwok Chen & Heid LLP

(57) ABSTRACT

In an electric contact probe assembly, an electroconductive patch is attached to a part of the support sheet so as to cover a through hole formed in the support sheet from a front side thereof, and a base end of an electroconductive resilient probe member is attached to the patch. The patch is connected to a terminal of a circuit board both electrically and physically via a solder lump placed in the through hole. The patch may also be attached to the reverse side of the support sheet. In this case, the base end of the resilient probe member is partly received in the through hole. The contact probe assembly of the present invention is suited for a high density design comprising a large number of extremely small resilient probe members one next to the other while simplifying the fabrication process.

16 Claims, 12 Drawing Sheets

ELECTRIC CONTACT PROBE ASSEMBLY

TECHNICAL FIELD

The present invention relates to an electric contact probe assembly which is suitable for use in various sockets for electrically testing semiconductor-related products and probes for wafer tests and burn-in tests of wafers.

BACKGROUND OF THE INVENTION

Electric contact probe assemblies of various structures are used for electrically testing conductive patterns of printed circuit boards and electronic component parts (such as oven accelerated aging tests, environment tests and burn-in tests), and as a part of contact probes for testing semiconductor wafers and sockets (including those for permanent use) and connectors for semiconductor devices (which may be in LGA, BGA, CSP and bear chip packages).

The signal frequency that needs to be handled by such sockets for semiconductor devices may reach the level of several hundred MHz with the recent demand for high frequency semiconductor devices. Therefore, the sockets that are used for such high speed semiconductor devices are required to use electric contact probe assemblies demonstrating correspondingly low inductance and low electric resistance. To achieve such a goal or the reduction in the inductance and electric resistance, the applicant of this application previously proposed in Japanese patent application No. 8-188199 to use,a coil end of a coil spring as a probe member for engagement with the object to be contacted so as to integrate the probe member with the compression coil spring.

As mentioned earlier, in the case of an electric contact probe assembly using a coil-shaped resilient probe member consisting solely of a coil spring, because the connection between the coil spring and the probe member requires no length at all, a low-profile design is possible particularly when a plurality of electric contact probe assemblies are arranged one next to the other, and the performance in high frequency ranges can be improved. However, when the electric contact probe assemblies are provided on a circuit board (such as those for relaying signals to a test circuit), because an end of each coil spring is required to be attached to the corresponding terminal of the circuit board by soldering or the like, the handling of the assembly is becoming more and more difficult with the demand for an ever smaller spacing between adjacent electric contact probe assemblies.

This trend also results in the restriction on the selection of the solder that can be used for such soldering work. For instance, when soldering a coil end of a coil-shaped resilient probe member to a circuit board such as a test mother board, the soldering procedure using a mask which is commonly used in connection with printed circuit boards may not be satisfactory because the solder may rise up to a coarse turn section of the extremely small coil-shaped resilient probe member due to the capillary effect Therefore, a special soldering procedure may become necessary so as to accurately control the solder thickness, and this inevitably complicates the soldering work.

Also, when a plate-shaped housing is used which is provided with holder holes each receiving a coil-shaped resilient probe member so as to project a coil end, the soldering work must be carried out so as to prevent the coil-shaped resilient probe members from dropping off from the corresponding holder holes, and this complicates the structure of the assembly.

BRIEF SUMMARY OF THE INVENTION

In view of such problems of the prior art, a primary object of the present invention is to provide an electric contact probe assembly which is suited for a high density design while simplifying the fabrication process.

A second object of the present invention is to provide an electric contact probe assembly which is suited for a high density design and provides a favorable high frequency performance.

A third object of the present invention is to provide an electric contact probe assembly which demonstrates low electric resistance.

A fourth object of the present invention is to provide an electric contact probe assembly which is economical.

According to the present invention such objects can be accomplished by providing an electric contact probe assembly, comprising: a non-electroconductive support sheet having a front and reverse sides and at least one through hole; an electroconductive patch attached to a part of the support sheet adjacent to the through hole; an elecroconductive resilient probe member having a base end attached to the patch and a free end projecting from the front side of the support sheet; and a circuit board placed over the reverse side of the support sheet and having a circuit layer incorporated therein and a terminal facing the reverse side of the support sheet; the support sheet being fixedly attached to the circuit board by an electroconductive bonding member which both physically and electrically connects the patch with the terminal.

Because the resilient probe member is integrally incorporated in the support sheet, the resilient probe member can be handled via the support sheet, and this is particularly significant when a large number of resilient probe members are arranged on a single support sheet in the form of a sheet. The support sheet allows the through holes to be formed without any difficulty, and by fixedly attaching an electroconductive patch to the support sheet so as to align with the through hole, not only the support sheet can be physically attached to the terminal of the circuit board with the electroconductive bonding member such as solder, brazing material or an electroconductive bonding agent filled in the through hole but also the resilient probe member can be electrically connected to the terminal via the electroconductive member. The absence of any intervening element in the path of electric connection contributes to the improvement of the high frequency performance.

If the resilient probe member consists of a coil spring, and one of the coil ends of thereof is fixedly attached to the electroconductive patch, the electric contact probe assembly can be easily formed by using such a coil spring. If the one coil end is defined by a plane extending perpendicularly to the axial line of the coil spring, the perpendicularity of the coil-shaped resilient probe member can be ensured without any difficulty, and the assembling work is simplified.

If the other coil end of the coil spring is provided with a small diameter turn adapted to be received within a remaining part of the coil spring when the coil spring is axially compressed, the contact area for the object to be contacted is enlarged, and a concentration of the load can be avoided. In particular, when contacting the coil end with a solder ball or the like, the denting of the solder ball or the like can be avoided.

A housing layer may be placed over the front side of the support sheet, the housing layer defining a holder hole through which a free end of the compression coil spring projects, so that the lateral collapsing of the coil-shaped contact probe member may be avoided. An end of the holder hole remote from the support sheet may be provided with an internal flange which controls a projecting length of the free end of the compression coil spring. The contact probe member may also consist of a cantilever sheet spring.

According to a preferred embodiment of the present invention, the patch is attached to the front side of the support sheet so as to expose at least a part of the patch to the interior of the through hole. The patch may entirely cover the through hole, and may be provided with a central opening which allows an automatic adjustment of the electroconductive bonding member.

The patch may also be attached to the reverse side of the support sheet so as to expose at least a part of the patch to the interior of the through hole. Such an embodiment allows the thickness of the assembly to be minimized. For the convenience of retaining the base end of the coil-shaped contact probe member, the patch may include an axial projection which extends into the through hole. The axial projection typically consists of an annular or cylindrical projection so that the base end of the coil-shaped probe may be fitted onto or into the projection.

The electric contact probe assembly can be fabricated by a method comprising the steps of: preparing a non-electroconductive support sheet having a front and reverse sides and at least one through hole; attaching an electroconductive patch to a part of the support sheet adjacent to the through hole; attaching a base end of an electroconductive resilient probe member to the patch so as to cause a free end thereof project from the front side of the support sheet; preparing a circuit board having a circuit layer incorporated therein and a terminal exposed on one side thereof; depositing an amount of soldering or brazing material on at least one of the patch and the circuit board terminal; placing the circuit board over the reverse side of the support sheet with the terminal directly opposing the patch; and melting and resolidifying the soldering or brazing material so as to connect the patch and the circuit board terminal together both electrically and physically.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
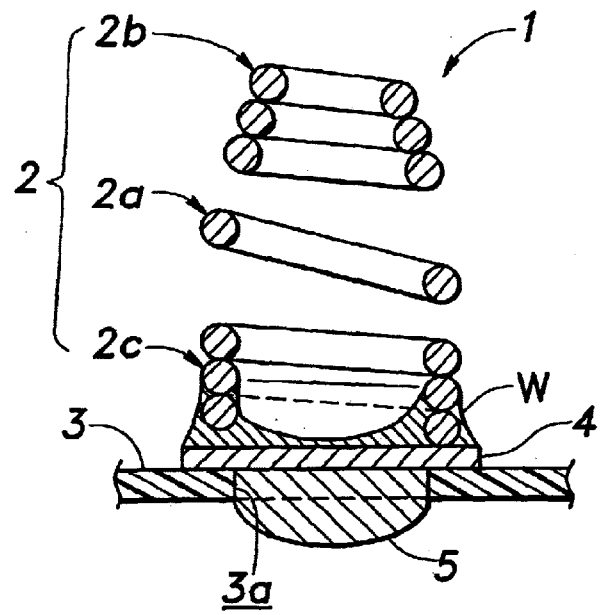
FIG. 1 is a vertical sectional view of an electric contact probe assembly embodying the present invention before a relay circuit board is assembled thereto.

FIG. 1 is a vertical sectional view of an electric contact probe assembly 1 embodying the present invention. This electric contact probe assembly 1 comprises a coil-shaped resilient probe member 2 formed by coiling an electroconductive spring wire member. The coil-shaped resilient probe member 2 comprises a coarsely wound section 2a having a prescribed coarse pitch and formed in an intermediate part thereof, an electrode section 2b formed on a free axial end side of the coarsely wound section 2a as a closely wound conical section and having a tapered outer end, and a closely wound section 2c formed on the opposite axial end of the coarsely wound section 2a and having a same diameter as the coarsely wound section 2a.

The closely wound section 2c shown in a lower part of FIG. 1 is soldered (as indicated by letter W in the drawing) to a patch 4, for instance, formed of a copper layer to serve as an electroconductive member and fixedly attached to a non-electroconductive support sheet. It is also possible to use an electroconductive bonding agent to fixedly attach the base end of the coil-shaped resilient probe member 2. The support sheet 3 is formed with a through hole 3a extending across the thickness of the support sheet 3 by etching or laser beam radiation in alignment with the patch 4.

The through hole 3a is filled with a solder lump 5 which is bonded to the part of the patch 4 exposed to the interior of the through hole 3a, and the solder lump 5 rises out of the external end (remote from the patch 4) of the through hole 3a. The solder W and the solder lump 5 may consist of the common solder material which is routinely used for the soldering of printed circuit boards. The bonding between the support sheet 3 and the patch 4 may be carried out by using a suitable bonding agent. Also, the support sheet 3 may be formed with a thermoplastic but heat resistant synthetic resin material which softens on the surface when heated to a prescribed temperature and demonstrates a bonding capability when cooled, and the thermoplastic surface may be used as a bonding agent. In this case, the support sheet 3 may be formed as an extremely thin (25 μm) film so that a large number of patches 4 may be attached thereto without any difficulty. Minimizing the thickness of the support sheet 3 reduces the thickness of the electric contact probe assembly, and hence contributes to the reduction in the thickness of the entire assembly.

Figure 2:
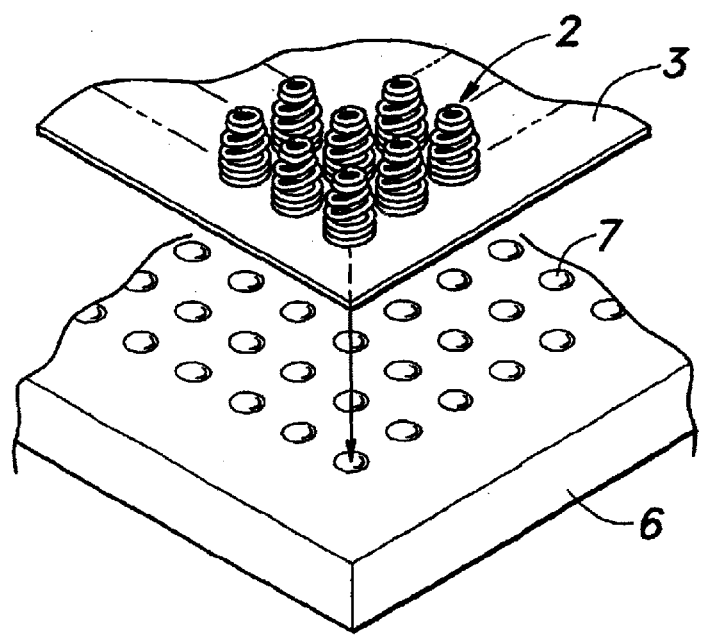
FIG. 2 is an exploded perspective view of an essential part of the electric contact probe assembly of FIG. 1.

The electric contact probe assembly according to the present invention can be used individually as one can readily appreciate, but is also suitable for use as a multiple-pin electric contact probe assembly in which a plurality of coil-shaped resilient probe members 2 are arranged one next to the other on a single support sheet 3 as shown in FIG. 2. Although only one electric contact probe assembly is illustrated in the drawings except for FIG. 2 for the convenience of illustration, when the semiconductor device product to be tested has a plurality of pins, a corresponding number of coil-shaped resilient probe members would be arranged as illustrated in FIG. 2.

Figure 3:
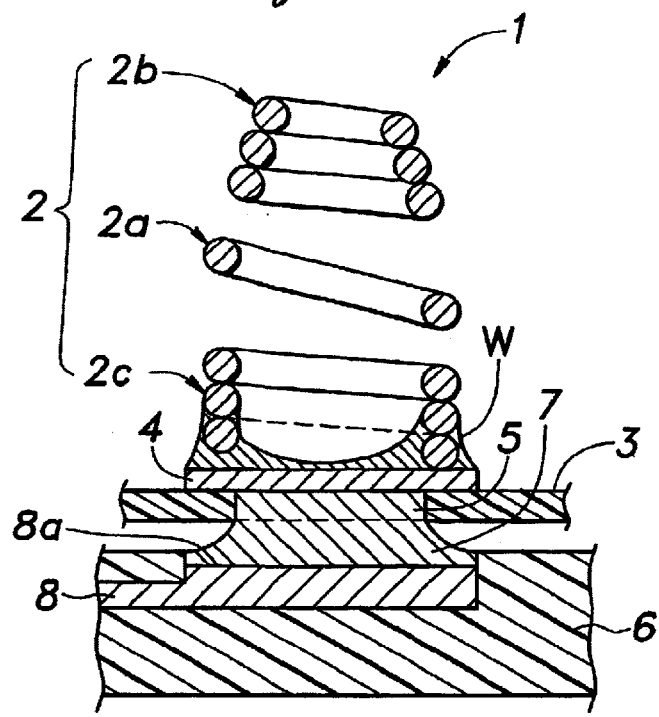
FIG. 3 is a view similar to FIG. 1 after the relay circuit board is assembled thereto.

FIG. 2 shows a part of a relay board 6 serving as a circuit board which is connected to a testing circuit not shown in the drawings. A lump of cream solder 7 is deposited on the surface of the circuit board 6 at each of a plurality of points corresponding to the terminals of a chip to be tested. The support sheet 3 is laid over the relay circuit board 6 with each cream solder lump 7 aligned with a corresponding one of the solder lumps 5 as indicated by the arrow in FIG. 2, and these two solder parts are welded together in a reflow process so that the support sheet 3 (electric contact probe assembly 1) is integrally attached to the relay circuit board 6 as shown in FIG. 3.

The relay circuit board 6 is provided with an internal circuit layer 8, and a pit is formed in the surface of the relay circuit board 6 facing the support sheet 3. A part of the internal circuit layer 8 is exposed at the bottom of the pit to define a land 8a, and the cream solder lump 7 is applied onto the land 8a by using a mask.

Figure 4:
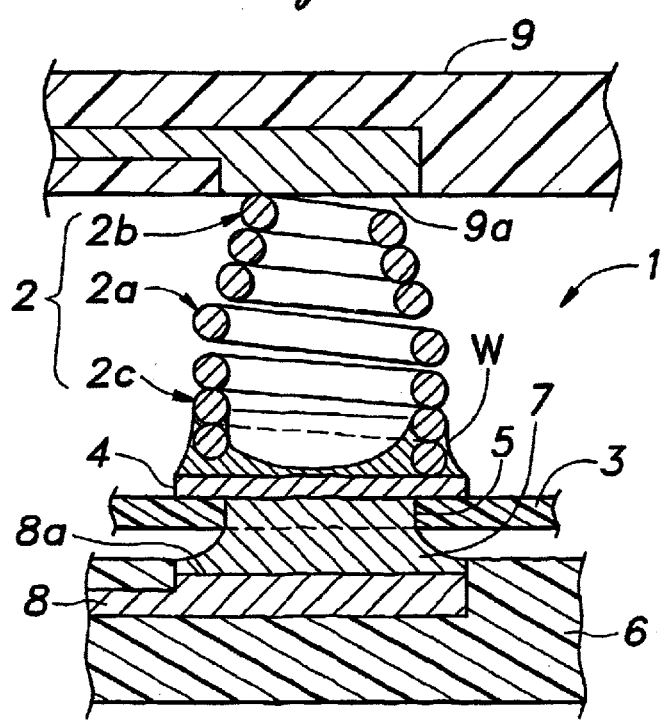
FIG. 4 is a view similar to FIG. 1 when the probe member is brought into contact with a terminal of a semiconductor chip.

The electrode section 2b of the electric contact probe assembly 1 connected to the testing circuit is brought into contact with a pad 9a of a chip 9 to be tested by placing the chip 9 onto the coil-shaped resilient probe member 2 as shown in FIG. 4. As the chip 9 is pushed toward the relay circuit board 6 by a prescribed stroke, the coil-shaped resilient probe member 2 undergoes a compressive deformation, and the electrode section 2b can be pushed against the pad 9a under a prescribed spring load so that a reliable and stable state of contact can be achieved.

A burn-in test can be conducted in this manner. Electric current flows axially through the coil-shaped resilient probe member 2 as far as the closely wound electrode section 2b and the closely wound conical section or the electrode section 2c are concerned, and circumferentially through the coil-shaped resilient probe member 2 only in the coarsely wound section 2a (which consists of a single turn in the case of the illustrated embodiment). Therefore, the electric flow path is extremely short, and this contributes to the reduction in the resistance and inductance against the transmission of high frequency signals. The connection to the relay circuit board 6 is achieved by soldering, instead of a simple contact by an electrode (as is the case with an electric contact probe assembly having two moveable ends), so that the problem of a contact resistance does not exist. By minimizing the thickness of the support sheet 3, the thickness of the electric contact probe assembly 1 (the axial length of the coil-shaped resilient probe member 2) can be minimized, and so is the overall thickness of the electric contact probe assembly.

Figure 5:
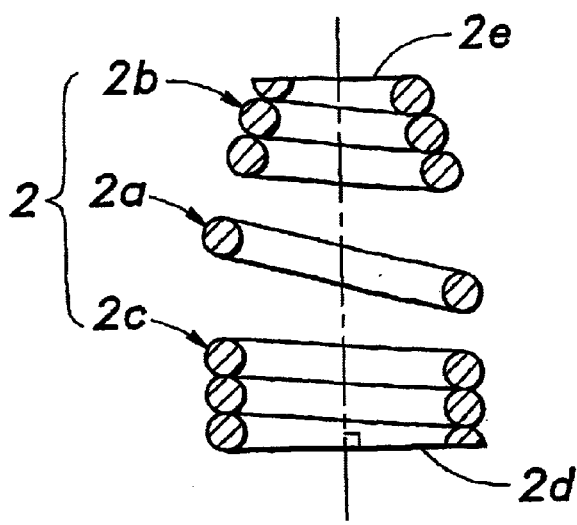
FIG. 5 is a vertical sectional view of a coil-shaped resilient probe member having both ends ground.

When the electrode section 2b of the coil-shaped resilient probe member 2 is desired to be brought into contact with the object to be contacted in the axial direction, the electrode section 2b should have a perpendicularity as precisely as possible. Therefore, the coil end of the closely wound section 2c of the coil-shaped resilient probe member 2 may be ground so as to form a ground surface 2d which is perpendicular to the axial line of the coil-shaped resilient probe member 2 (the center line in the drawing) as shown in FIG. 5. This facilitates the placement of the coil-shaped resilient probe member 2 on the support sheet 3. In the case of the embodiment shown in FIG. 5, both ends of the coil are ground. Therefore, the coil end of the electrode section 2b is also formed with a ground surface 2e which is perpendicular to the coil axial line. As a result, the electrode section 2b can be brought into contact with the planar pad 9a such as the one as illustrated in FIG. 4 in a stable fashion. In particular, because the contact surface with respect to the pad 9a is relatively large, a localized high contact pressure can be avoided, and the pad 9a would not be damaged even when it is made of a relatively soft material.

Figure 6:
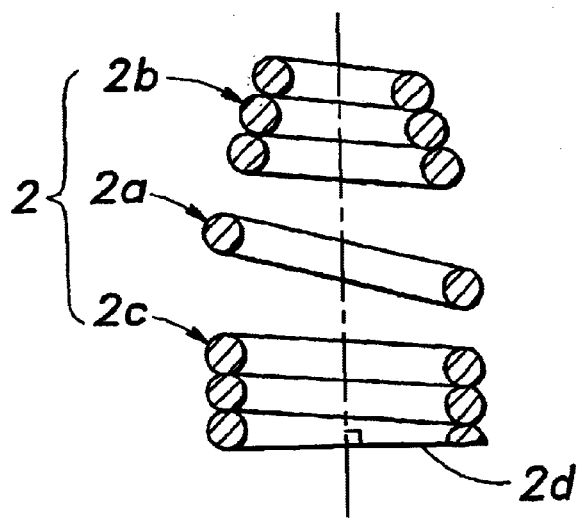
FIG. 6 is a vertical sectional view of a coil-shaped resilient probe member having only one end ground.
Figure 7:
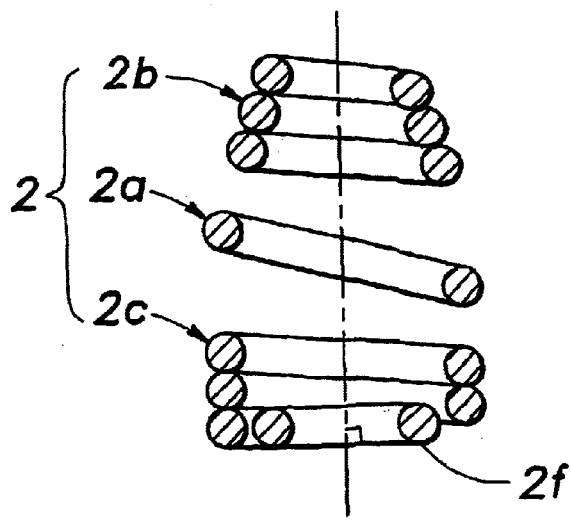
FIG. 7 is a vertical sectional view of a coil-shaped resilient probe member having a small diameter section fitted into the base end thereof.

When only a perpendicularity is required, only one end of the coil may be ground by forming a ground surface 2d only on the closely wound section 2c as shown in the embodiment illustrated in FIG. 6. It is also possible to form a reduced diameter end section 2f in the last turn of the coil end of the closely wound section 2c so as to allow the reduced diameter end section 2f to be received in the adjacent section under normal condition as shown in FIG. 7, and to provide a perpendicularity to this reduced diameter end section 2f. In this case, the gap between the inner circumferential surface of the closely wound section 2c and the reduced diameter end section 2f has the function to trap the solder, and can thereby prevent the solder from rising up to the coarsely wound section 2a. If the solder reaches the coarsely wound section 2a, the resilient probe member 2 may become unable to provide the required resiliency.

Figure 8:
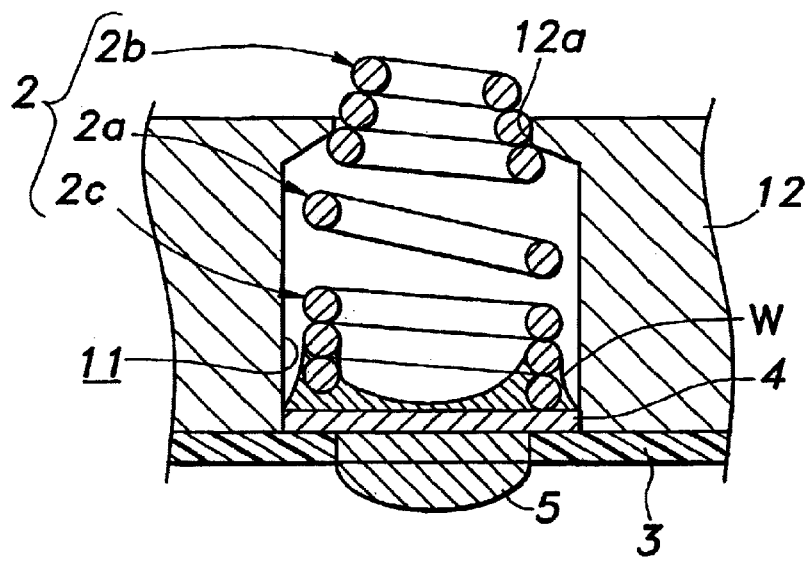
FIG. 8 is a vertical sectional view of a second embodiment of the present invention provided with a housing sheet.

To prevent the lateral collapsing of the coil-shaped resilient probe member 2 and ensure a stable contact in the axial direction, one may provide a housing sheet 12 formed with a holder hole 11 for coaxially receiving the coil-shaped resilient probe member 2 as shown in FIG. 8. In this case, the housing sheet 12 may be attached to a support sheet 3 like the one illustrated in FIG. 1 by placing the housing sheet 12 from above as seen in the drawing, and it can be accomplished by using a bonding agent or a bonding sheet. It is also possible to use the thermoplastic property of the support sheet 3 as was the case with the previously described embodiment.

The holder hole 11 is adapted to receive the coil-shaped resilient probe member 2 with only an end of the electrode section 2b thereof projecting outwardly (upward as seen in the drawing). The open end of the holder hole 11 is provided with an internal flange 12a which is provided with a tapered surface so as to engage the large diameter portion of the electrode section 2b to prevent the coil-shaped resilient probe member 2 from dislodging, to control the projecting length of the probe member 2, and to center the probe member 2.

Figure 9:
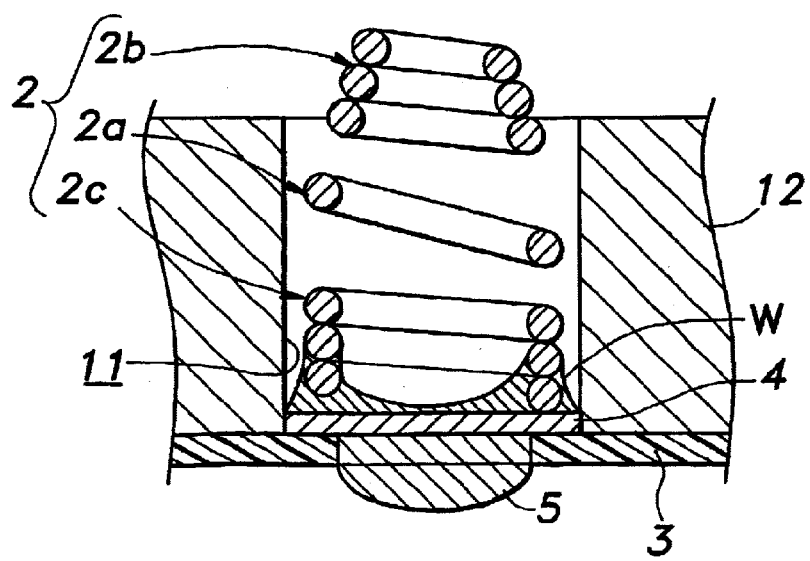
FIG. 9 is a view similar to FIG. 8 showing a third embodiment of the present invention.

The embodiment illustrated in FIG. 9 includes a holder hole 11 which is straight, instead of having an internal flange 12a such as the one shown in FIG. 8. According to this embodiment, the forming of the holder hole 11 is simplified, and following the bonding of the housing sheet 12 to the support sheet 3 as described above, the coil-shaped resilient probe member 2 may be simply dropped into the holder opening 11 so that the assembling process is simplified. The support sheet 3 and the housing 12 can be molded from a same plastic material by using suitable die assemblies, and this also contributes to the simplification of the manufacturing process.

Figure 10:
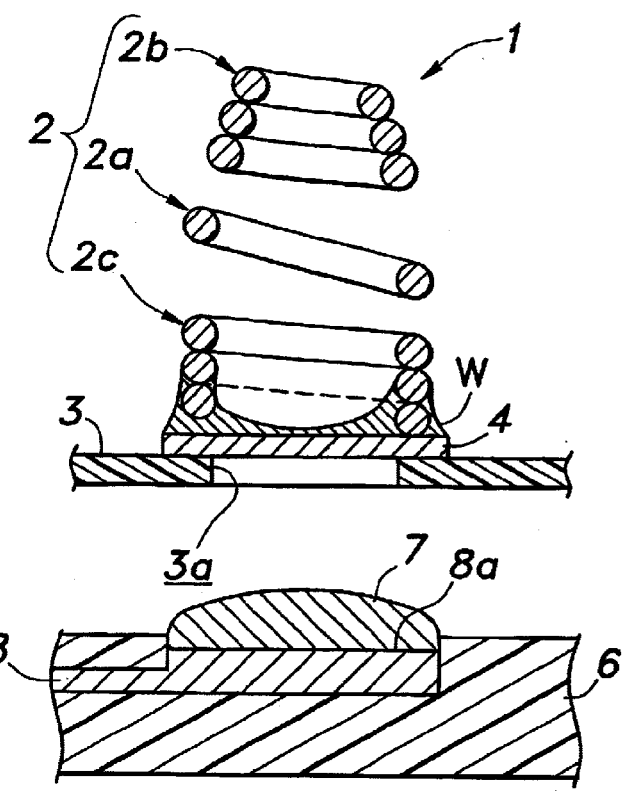
FIG. 10 is a vertical sectional view of a fourth embodiment of the present invention before a relay circuit board is assembled thereto.
Figure 11:
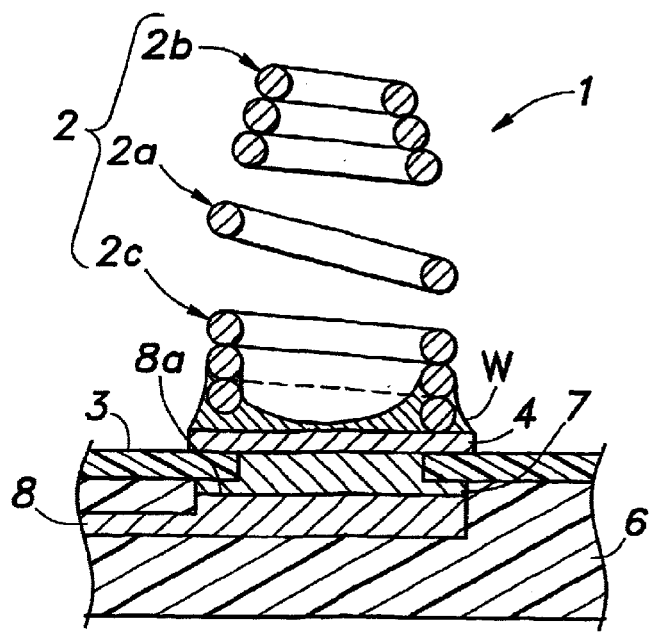
FIG. 11 is a view similar to FIG. 10 after the relay circuit board is assembled thereto.

In the embodiment illustrated in FIG. 1, the solder lump 5 was attached to the reverse surface (adjacent to the through hole 3a) of the patch 4. However, the solder lump 5 may not be necessarily attached to the reverse surface of the patch 4. For instance, as shown in FIG. 10, the support sheet 3 of the electric contact probe assembly 1 may be placed over the relay circuit board 6 without providing such a solder lump on the reverse surface of the patch 4, and the cream solder 7 on the land 8a may be simply melted and resolidified. As a result, part of the cream solder lump 7 fills into the through hole 3a and eventually attaches to the reverse surface of the patch 4. This in turn integrally joins the support sheet 3 to the relay circuit board 6 as illustrated in FIG. 11. In this case, because a rising part of the cream solder lump 7 fills into the through hole 3a, the support sheet 3 and the relay circuit board 6 are brought into close contact with each other, and the assembly can be given with an even smaller thickness.

Figure 12:
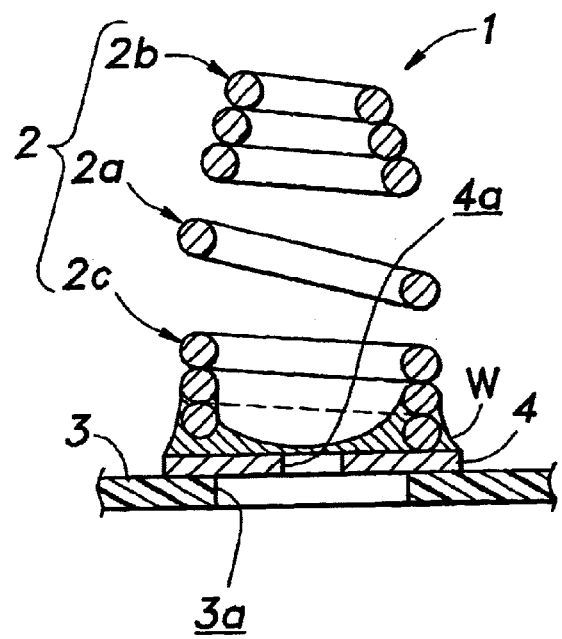
FIG. 12 is a vertical sectional view showing a fifth embodiment of the present invention before a relay circuit board is assembled thereto.
Figure 13:
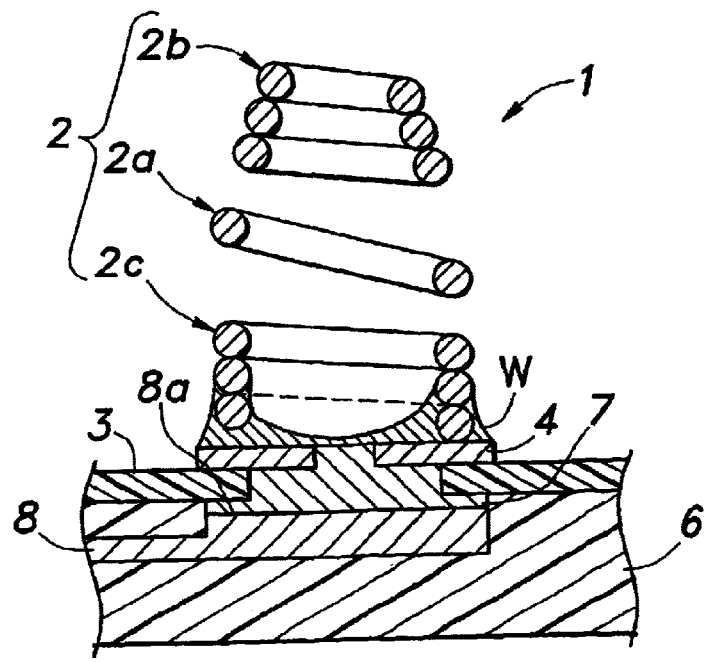
FIG. 13 is a view similar to FIG. 12 after the relay circuit board is assembled thereto.

As shown in FIG. 12, the patch 4 may be provided with a small diameter hole 4a passed centrally therethrough. When the support sheet 3 and the relay circuit board 6 are joined together by soldering as illustrated in FIG. 13, the solder lump W and the cream solder lump 7 are merged together so that the tendency to produce bubbles in the interface of each of the two solder lumps can be reduced, and the bubbles that may be produce are released from the small hole 4a. As a result, the amount of solder in the bonding area can be automatically adjusted, and a close contact between the support sheet 3 and the relay circuit board 6 can be ensured without regard to the amount of solder that is used.

Figure 14:
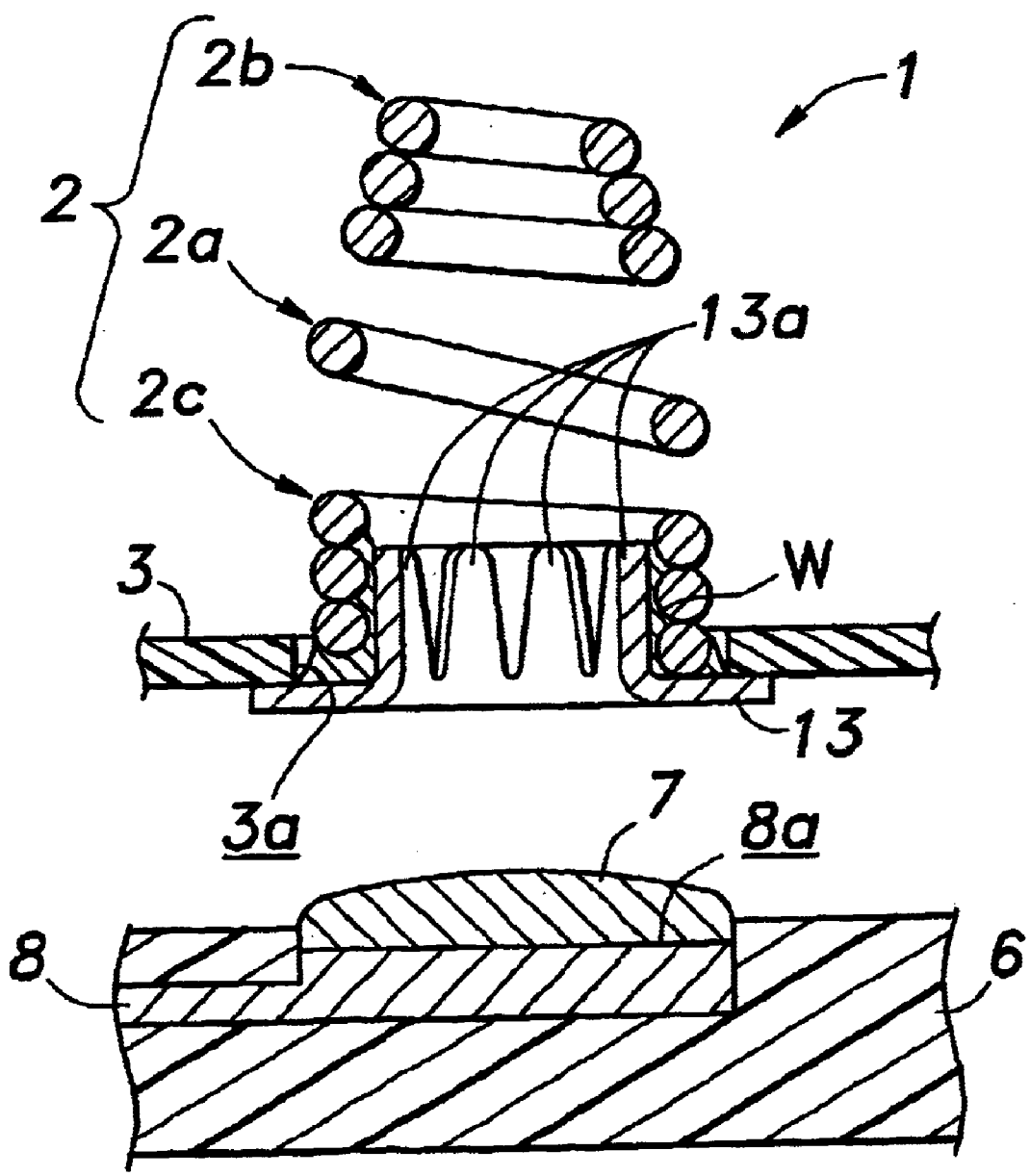
FIG. 14 is a vertical sectional view showing a sixth embodiment of the present invention before a relay circuit board is assembled thereto.

Yet another embodiment is shown in FIG. 14 which facilitates the assembling work by ensuring the perpendicularity of the coil-shaped resilient probe member 2. In the embodiment illustrated in FIG. 14, either before or after forming or attaching a patch 13 to the reverse surface of the support sheet 3 as seen in the drawing, a plurality of radial slits are cut into the part of the patch 13 which is to be exposed to the interior of the through hole 3a, and a plurality of raised pieces 13a which are separated by these slits are raised upward through the through hole 3a until they project above the support sheet 3 in the form of a crown as a result of a plastic deformation of the patch 13.

Figure 15:
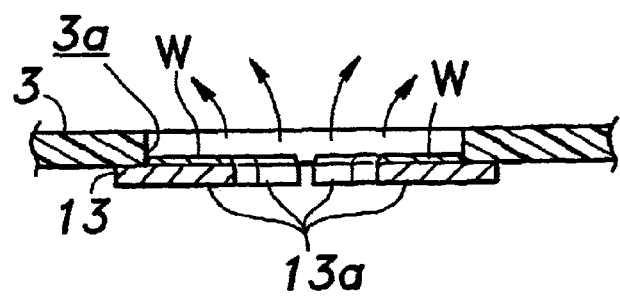
FIG. 15 is a vertical sectional view of the patch shown in FIG. 14 before the axial projection is formed.

The raised pieces 13a are deposited with a solder layer W on the faces thereof (upper faces in FIG. 15) facing the through hole 3a when attached to the support sheet 3 in advance and before they are raised as illustrated in FIG. 15. Thus, when the raised pieces 13a are raised, because the outer circumferential surface jointly defined by these raised pieces 13a carries an amount of solder thereon, the inner circumferential surface of the closely wound section 2c can be soldered to the outer circumferential surface of the raised pieces 13a, and the coil-shaped resilient probe member 2 is integrally attached to the support sheet 3.

In this case, the inner circumferential surfaces of the raised pieces 13a and the through hole 3a are dimensioned so as to define an annular gap between them to receive the coil wire of the closely wound section 2c. Therefore, when the coil-shaped resilient probe member 2 is integrally attached to the support sheet 3, the projecting height of the coil-shaped resilient probe member 2 can be reduced from that shown in FIG. 1 by the length of the part of the probe member 2 which is received inside the through hole 3a, and this contributes to the reduction in the overall thickness of the assembly.

Figure 16:
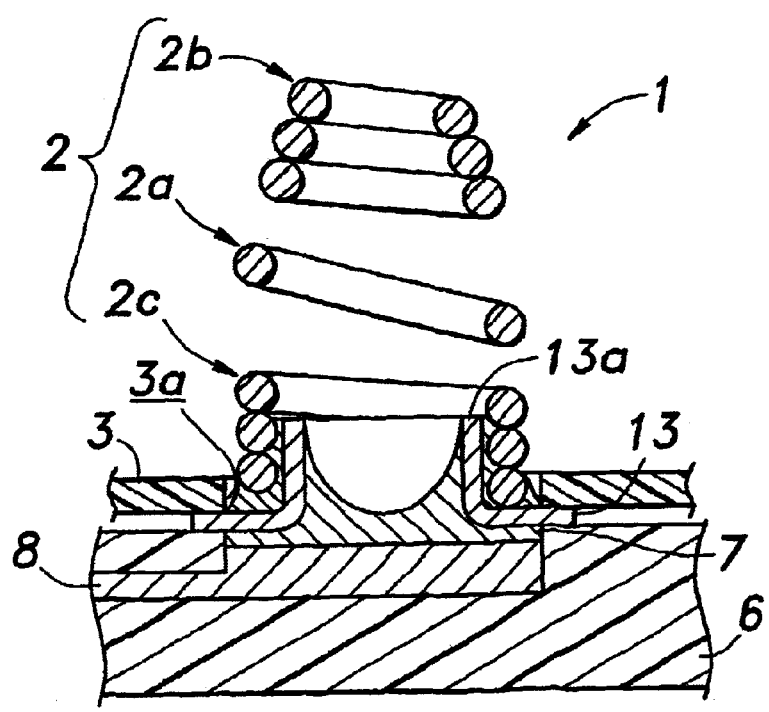
FIG. 16 is a view similar to FIG. 14 after the relay circuit board is assembled thereto.

In the electric contact probe assembly 1 having the above described structure, because the support sheet 3 is placed over the relay circuit board 6 having a lump of solder paste 7 deposited thereon as illustrated in FIG. 14, and melting the solder paste causes the solder to adhere to the reverse surface of the patch 13 and the inner circumferential surface of the raised pieces 13a, the electric contact probe assembly 1 can be thereby integrally attached to the relay circuit board 6 as illustrated in FIG. 16.

Figure 17:
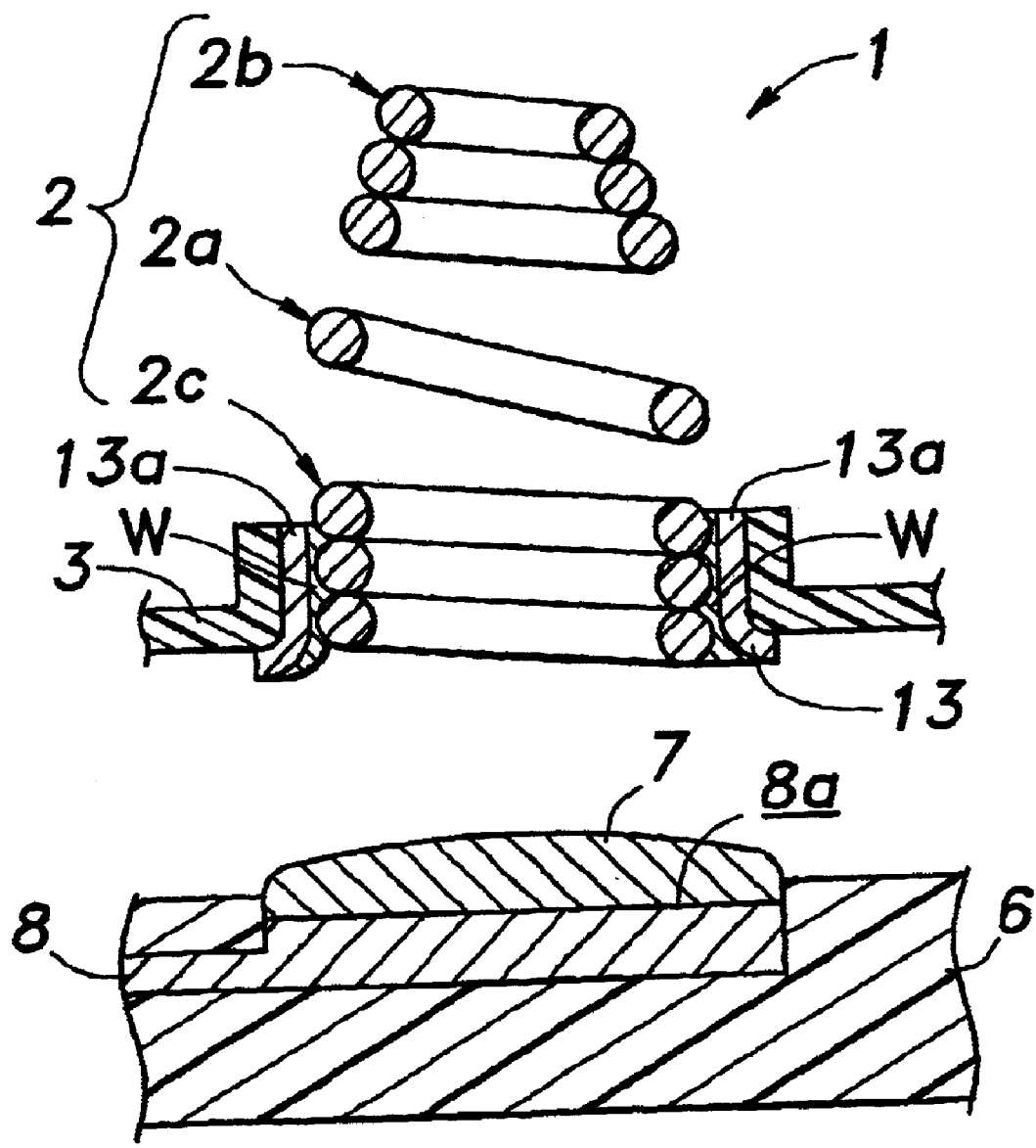
FIG. 17 is a vertical view showing a seventh embodiment of the present invention before a relay circuit board is assembled thereto.
Figure 18:
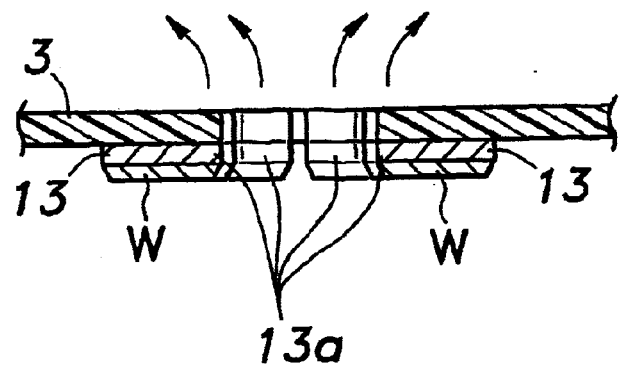
FIG. 18 is a sectional view of the patch shown in FIG. 17 before the axial projection is formed.

In the case of the embodiment illustrated in FIG. 17, the raised pieces 13a are raised along with the support sheet 3, and the outer circumferential surface of the closely wound section 2c is soldered to the inner circumferential surface of the raised pieces 13a. In this case, as shown in FIG. 18, the patch 13 is bonded to the lower surface of the support sheet 3 as seen in the drawing, and the raised pieces 13a are likewise defined by cutting a plurality of radial slits from the center. Some solder W is deposited on the lower surface of the patch 13 in advance, and the raised pieces 13a are raised along with the corresponding part of the support sheet 3 as indicated by the arrows in the drawing.

The closely wound section 2c can be integrally attached to the support sheet 3 with the coil end of the closely wound section 2c fitted into the inner bore jointly defined by the raised pieces, and located so as to reach the reverse surface of the base portion of the patch 13. By doing so, the projection of the coil-shaped resilient probe member 2 can be reduced even further (by the combined thickness of the support sheet 3 and the patch 13), and so is the thickness of the entire assembly.

Figure 19:
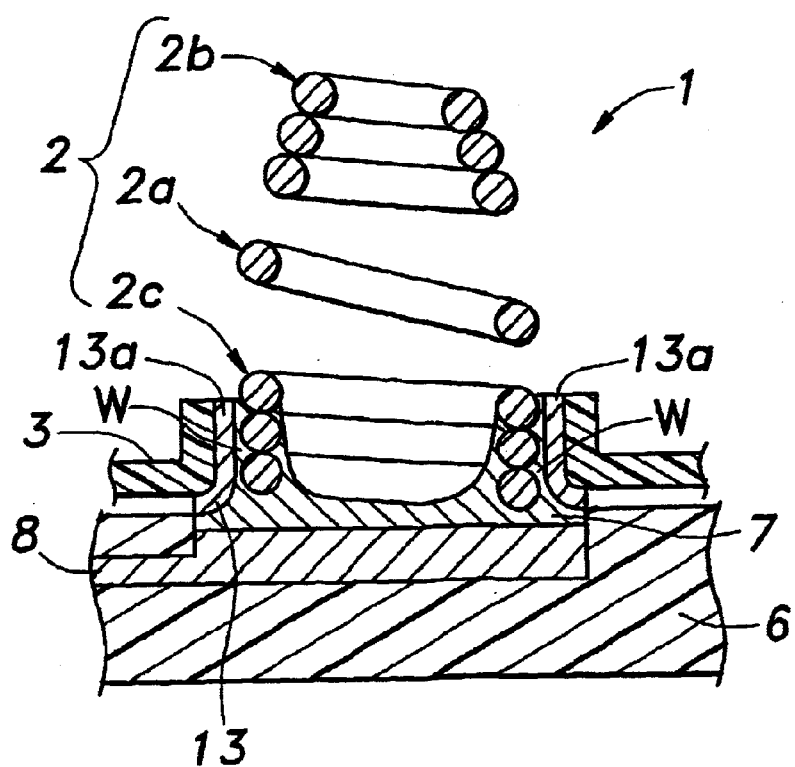
FIG. 19 is a view similar to FIG. 17 after the relay circuit board is assembled thereto.

In the electric contact probe assembly 1 having the above described structure, because the support sheet 3 is placed over the relay circuit board 6 having a solder paste lump 7 deposited thereon as shown in FIG. 17, and the solder adheres to both the reverse surface of the patch 13 and the inner circumferential surface of the closely wound section 2c by melting the solder paste 7, the electric contact probe assembly 1 is integrally attached to the relay circuit board 6 in favorable fashion as shown in FIG. 19.

Figure 20:
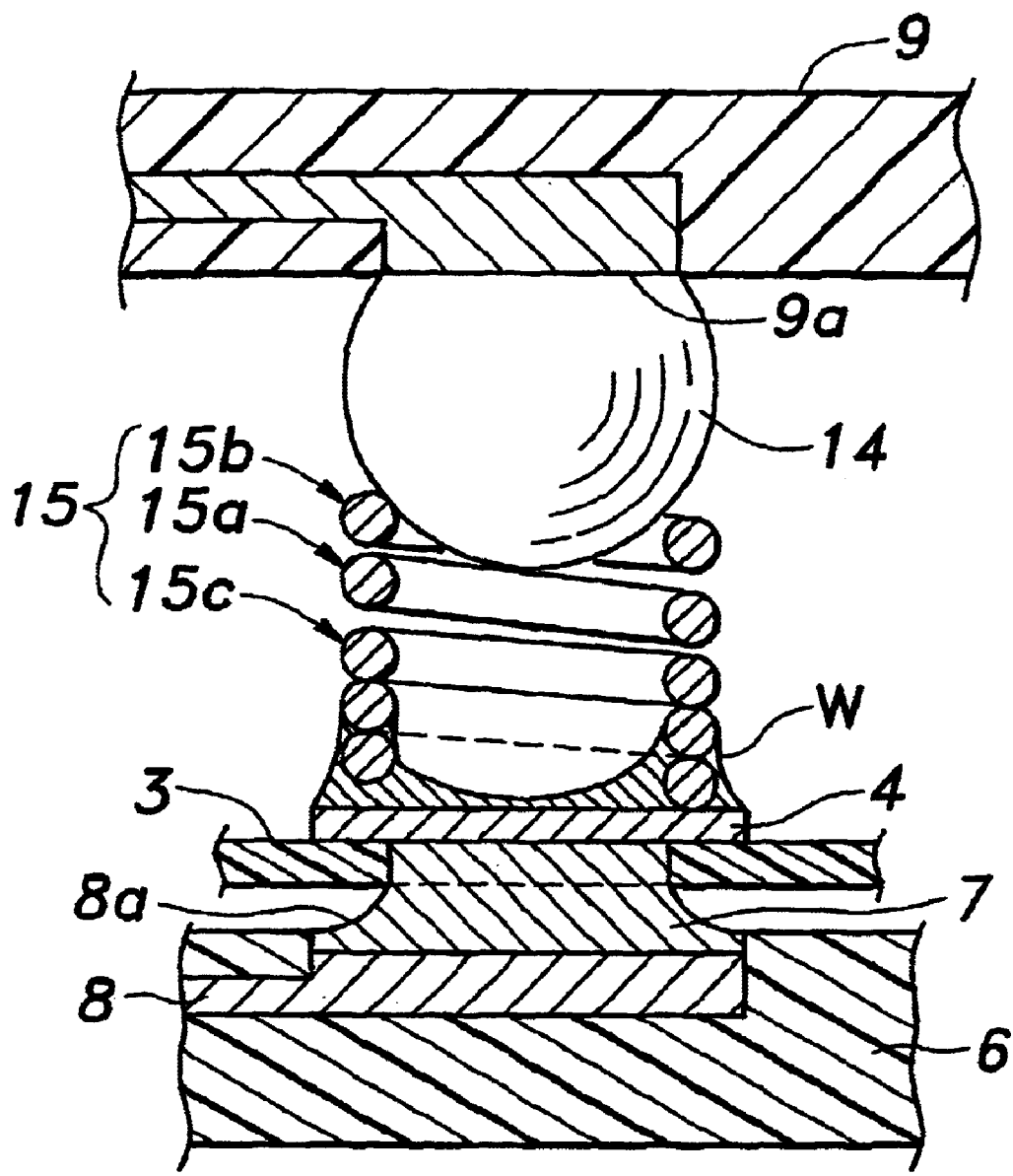
FIG. 20 is a vertical sectional view showing an eighth embodiment of the present invention which is adapted for contact with a solder ball.

The object to be contacted is not limited to those having a planar surface as was the case with the pad 9a which was illustrated earlier, but may have a bulging surface as shown on the solder ball 14 in FIG. 20. This coil-shaped resilient probe member 15 comprises an intermediate coarsely wound section 15a, a closely wound section 15c on a coil end which is soldered to the patch 4, and an electrode section 15b which consists of a coarsely wound section connected to the afore-mentioned coarsely wound section 15a.

Particularly when the electrode section 15b is resiliently brought into contact with the solder ball 14, the electrode section 15b contacts the solder ball 14 so as to wrap around it over a large contact area. For this reason, the possibility of making a dent in the solder ball 14 can be reduced as compared to the case where the contact is made via a pointed free end. Therefore, when soldering the solder ball 14 to a socket terminal or the like following the testing process, the soldering work can be conducted under a favorable condition.

In this straight coil-shaped resilient probe member 15 also, as was the case with the embodiments illustrated in FIG. 7, both ends may be ground, only one of the ends may be ground or a reduced diameter section (planar end) may be provided on the base end, and these embodiments produce similar results as the corresponding embodiments shown in FIGS. 5 to 7.

Figure 21:
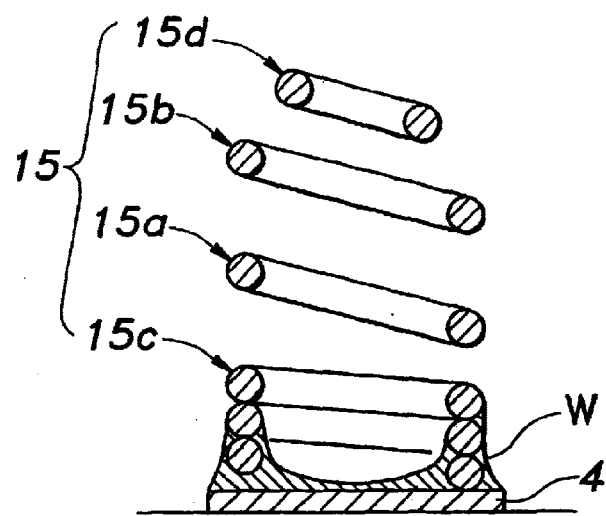
FIG. 21 is a vertical sectional view of the coil-shaped probe member used in a ninth embodiment of the present invention.
Figure 22:
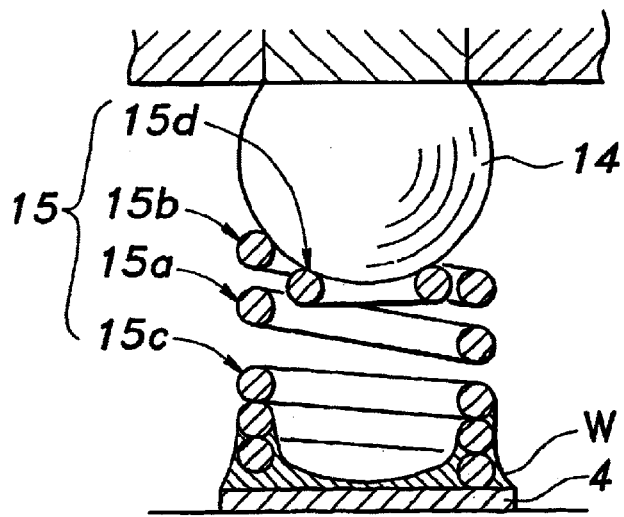
FIG. 22 is a view similar to FIG. 20 showing the ninth embodiment of the present invention when the coil-shaped probe member is brought into contact with a solder ball.

As a measure against making a dent in the solder ball 14, a reduced diameter section 15 dimensioned so as to fit into the interior of the adjacent turn without being interfered by the coil wire of the adjacent turn may be provided in the electrode section 15b of the coil-shaped resilient probe member 15 as shown in FIG. 21. By so doing, when the electrode section 15b is brought into contact with the solder ball 14 as shown in FIG. 22, the reduced diameter section 15d can deflect into the coarsely wound section 15a without being interfered by the coil wire of the adjacent turns. Therefore, the contact area between the electrode section 15b and the solder ball 14 can be increased, and the creation of dents can be avoided even more effectively.

Figure 23:
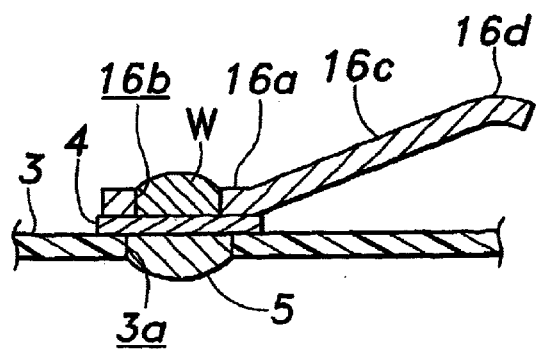
FIG. 23 is a vertical sectional view of a tenth embodiment of the present invention using a sheet spring for the probe member.

Coil-shaped resilient probe members were used in the above described embodiments, but the shape of the resilient probe member is not limited to such coil-shaped members according to the present invention. For instance, the probe member may consist of a sheet spring type resilient probe member 16 using an obliquely raised sheet spring as shown in FIG. 23. In this sheet spring type resilient probe member 16, a through hole 16b is formed in a base end portion 16a, and the base end portion 16a is soldered to the patch 4 by filling the through hole 16b with a solder lump W. The intermediate portion extending obliquely upward from the bonded base end portion 16a serves as a spring portion 16c while the other end portion forms an electrode-section 16d which is adapted to be. brought into contact with an object to be contacted. This sheet spring type resilient probe member 16 is otherwise similar to the previous embodiments, and provides similar advantages.

Thus, the present invention provides favorable handling even when a large number of resilient probe members are provided on a single support sheet. Because through holes can be easily formed in such a support sheet, by fixedly attaching an electroconductive member to the support sheet with a part of the electroconductive member exposed to the through hole, the support sheet can be bonded to the terminal of the circuit board by virtue of the solder or brazing material which is filled into the through hole. Because there is no intervening contact member in the path of electric conduction, the high frequency performance can be improved, and a satisfactory testing of semiconductor devices for high frequency signals is made possible.

By forming the resilient probe member with a coil spring, a compact design is made possible. Also, by defining a coil end with a plane perpendicular. to the axial line of the coil spring, the perpendicularity can be easily achieved when installing the coil-shaped resilient probe member, and this simplifies the assembling work. By providing a reduced diameter section on the other end of the coil spring so as to be received inside the adjacent coil turns, the contact area for the contact with the object to be contacted can be increased, and a localized load can be avoided. In particular, when the coil end is to be brought into contact with a solder ball, creation of a dent in the solder ball can be avoided.

Although the present invention has been described in terms of preferred embodiments thereof, it is obvious to a person skilled in the art that various alterations and modifications are possible without departing from the scope of the present invention which is set forth in the appended claims.

What is claimed is:

1. An electric contact probe assembly, comprising:

a non-electroconductive support sheet having a front and reverse sides and at least one through hole;

an electroconductive patch attached to a part of the support sheet adjacent to the through hole;

an electroconductive resilient probe member having a base end attached to the patch and a free end projecting from the front side of the support sheet; and a circuit board placed over the reverse side of the support sheet and having a circuit layer incorporated therein and a terminal facing the reverse side of the support sheet;

the support sheet being fixedly attached to the circuit board by an electroconductive bonding member which both physically and electrically connects the patch with the terminal.

2. An electric contact probe assembly according to claim 1, wherein the electroconductive resilient probe member comprises a compression coil spring.

3. An electric contact probe assembly according to claim 2, wherein the compression coil spring comprises a closely wound conical section at a free end thereof.

4. An electric contact probe assembly according to claim 2, wherein the compression coil spring comprises a coarsely wound section at a free end thereof which is adapted to fit over a solder ball which is desired to be contacted.

5. An electric contact probe assembly according to claim 2, further comprising a housing layer placed over the front side of the support sheet, the housing layer defining a holder hole through which a free end of the compression coil spring projects.

6. An electric contact probe assembly according to claim 5, wherein an end of the holder hole remote from the support sheet is provided with an internal flange which controls a projecting length of the free end of the compression coil spring.

7. An electric contact probe assembly according to claim 1, wherein the electroconductive resilient probe member comprises a cantilever sheet spring.

8. An electric contact probe assembly according to claim 1, wherein the patch is attached to the front side of the support sheet so as to expose at least a part of the patch to the interior of the through hole.

9. An electric contact probe assembly according to claim 8, wherein the patch entirely covers the through hole, and is provided with a central opening.

10. An electric contact probe assembly according to claim 1, wherein the patch is attached to the reverse side of the support sheet so as to expose at least a part of the patch to the interior of the through hole.

11. An electric contact probe assembly according to claim 10, wherein the patch includes an axial projection which extends into the through hole.

12. An electric contact probe assembly according to claim 11, wherein the electroconductive resilient probe member comprises a compression coil spring, and the axial projection of the patch is substantially cylindrical in shape, the base end of the compression coil spring being fitted into the cylindrical axial projection of the patch.

13. An electric contact probe assembly according to claim 11, wherein the electroconductive resilient probe member comprises a compression coil spring, and the axial projection of the patch is substantially cylindrical in shape, the base end of the compression coil spring being fitted onto the cylindrical axial projection of the patch.

14. An electric contact probe assembly according to claim 1, wherein the electroconductive bonding member comprises a solder lump.

15. An electric contact probe assembly according to claim 1, wherein the base end of the resilient probe member is attached to the patch by soldering.

16. A method for making an electric contact probe assembly, comprising the steps of:

preparing a non-electroconductive support sheet having a front and reverse sides and at least one through hole;

attaching an electroconductive patch to a part of the support sheet adjacent to the through hole;

attaching a base end of an electroconductive resilient probe member to the patch so as to cause a free end thereof to project from the front side of the support sheet;

preparing a circuit board having a circuit layer incorporated therein and a terminal exposed on one side thereof;

depositing an amount of soldering or brazing material on at least one of the patch and the circuit board terminal;

placing the circuit board over the reverse side of the support sheet with the terminal directly opposing the patch; and melting and resolidifying the soldering or brazing material so as to connect the patch and the circuit board terminal together both electrically and physically.

* * * * *